United States Patent
Chen et al.

(10) Patent No.: US 10,122,361 B2
(45) Date of Patent: Nov. 6, 2018

(54) ELECTRONIC DEVICE AND ASSOCIATED SIGNAL PROCESSING METHOD

(71) Applicant: MStar Semiconductor, Inc., Hsinchu Hsien (TW)

(72) Inventors: Wei-Ling Chen, Hsinchu Hsien (TW); Chun Wen Yeh, Hsinchu Hsien (TW); Yan-Cheng Lin, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 3 days.

(21) Appl. No.: 15/368,914

(22) Filed: Dec. 5, 2016

(65) Prior Publication Data

US 2017/0324412 A1    Nov. 9, 2017

(30) Foreign Application Priority Data

May 3, 2016    (TW) .............................. 105113766 A

(51) Int. Cl.
| | | |
|---|---|---|
| *H03K 19/0175* | (2006.01) | |
| *H03K 5/19* | (2006.01) | |
| *H03K 17/28* | (2006.01) | |
| *G06F 13/00* | (2006.01) | |
| *H03K 5/00* | (2006.01) | |

(52) U.S. Cl.
CPC ....... *H03K 19/01759* (2013.01); *G06F 13/00* (2013.01); *H03K 5/19* (2013.01); *H03K 17/28* (2013.01); *H03K 19/017509* (2013.01); *H03K 2005/00241* (2013.01)

(58) Field of Classification Search
CPC ......... H03K 17/28; H03K 19/0175–19/01759; H03K 19/018–19/018592; H03K 5/19; G06F 13/00
See application file for complete search history.

(56) References Cited

U.S. PATENT DOCUMENTS

| | | | | |
|---|---|---|---|---|
| 7,516,029 | B2* | 4/2009 | Kim ...................... | H04L 5/1438 702/69 |
| 7,589,557 | B1* | 9/2009 | Bergendahl ............ | H03K 5/159 326/37 |
| 9,806,916 | B1* | 10/2017 | Zerbe ................ | H04L 25/03019 |
| 2003/0160651 | A1* | 8/2003 | Lin .......................... | H03K 5/19 330/2 |

(Continued)

Primary Examiner — Thomas J Hiltunen
(74) Attorney, Agent, or Firm — Edell, Shapiro & Finnan, LLC

(57) ABSTRACT

An electronic device includes a transmission interface, a driving circuit, a receiving circuit, a sampling circuit, a detecting circuit, a timing control circuit and a processing circuit. The transmission interface is for connecting to another electronic device via a connecting cable. The driving circuit outputs a backward signal via the transmission interface to the another electronic device. The receiving circuit receives a received signal including the backward signal and a forward signal from the transmission interface. The sampling circuit samples the received signal to obtain a plurality of sample results. The detecting circuit detects transitions of the sample results to obtain a plurality of detection results. The processing circuit generates a control signal according to the detection results, and adjusts a time point at which the driving circuit outputs the backward signal through the timing control circuit.

18 Claims, 9 Drawing Sheets

(56) References Cited

U.S. PATENT DOCUMENTS

| | | | |
|---|---|---|---|
| 2005/0258865 A1* | 11/2005 | Behrendt | H03K 19/01759 326/82 |
| 2009/0033400 A1* | 2/2009 | Gupta | H03K 19/00384 327/333 |
| 2011/0239063 A1* | 9/2011 | Zerbe | G06F 13/1689 714/719 |
| 2015/0092308 A1* | 4/2015 | P | H01L 27/0248 361/56 |
| 2016/0269017 A1* | 9/2016 | Loke | H03K 17/0822 |
| 2017/0199725 A1* | 7/2017 | Hirai | G06F 7/50 |
| 2017/0246547 A1* | 8/2017 | Binder | A63H 3/28 |

* cited by examiner

ELECTRONIC DEVICE AND ASSOCIATED SIGNAL PROCESSING METHOD

This application claims the benefit of Taiwan application Serial No. 105113766, filed May 3, 2016, the subject matter of which is incorporated herein by reference.

BACKGROUND OF THE INVENTION

Field of the Invention

The invention relates in general to an electronic device that uses the same channel to transceive data to/from another electronic device and an associated signal processing method.

Description of the Related Art

In the Mobile High-Definition Link (MHL) 3.0 specifications, a channel transmission technology "eCBUS", allowing two electronic devices to transmit data and clock signals on a same channel, is defined. However, a superimposed waveform may be formed on the channel when the two electronic devices transmit data to each other, and so each of the electronic devices needs to first process received data in order to determine contents of the received data. The complexity and accuracy of the above signal processing are associated with the shape of the superimposed waveform, i.e., associated with time points at which the data is transmitted. Therefore, there is a need for a solution that accurately determines time points at which data is transmitted to facilitate subsequent data determination.

SUMMARY OF THE INVENTION

It is an object of the present invention to provide an electronic device and an associated signal processing method capable of accurately determining time points at which data is transmitted to solve issues of the prior art.

According to an embodiment of the present invention, an electronic device includes a transmission interface, a driving circuit, a receiving circuit, a sampling circuit, a detecting circuit, a timing control circuit and a processing circuit. The transmission interface is for connecting to another electronic device via a connecting cable. The driving circuits transmits a backward signal to the another electronic device via the transmission interface. The receiving circuit receives a received signal including a forward signal and the backward signal from the transmission interface, wherein the forward signal is outputted from the another electronic device. The sampling circuit samples the received signal to obtain a plurality of sample results. The detecting circuit detects the sample results to obtain a plurality of detection results. The timing control circuit controls a time point at which the driving circuit outputs the backward signal and a width of the backward signal. The processing circuit generates a control signal according to the detection results to accordingly adjust the time point at which the driving circuit outputs the backward signal.

According to another embodiment of the present invention, a signal processing method applied to an electronic device is provided. The electronic device is connected to another electronic device via a connecting cable, and receives a forward signal from the another electronic device via a channel in the connecting cable. The signal processing method includes: transmitting a backward signal to the another electronic device via a transmission interface; receiving a received signal including a forward signal and the backward signal from the transmission interface, the forward signal outputted from the another electronic device; sampling the received signal to obtain a plurality of sample results; and detecting the sample results to obtain a plurality of detection results; and generating a control signal according to the detection results to adjust a time point at which the backward signal is outputted.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
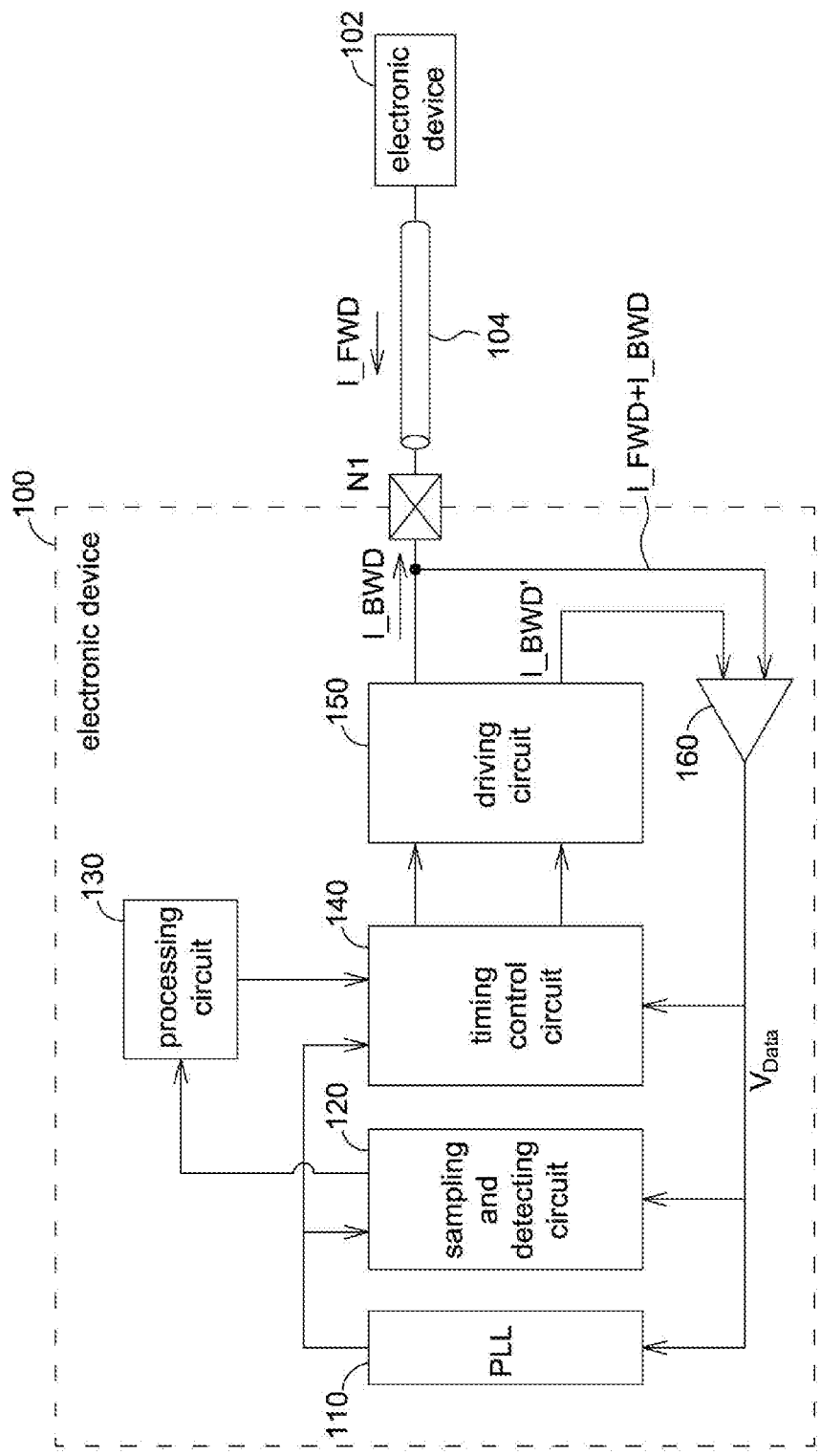
FIG. 1 is a block diagram of an electronic device according to an embodiment of the present invention.

FIG. 1 shows a block diagram of an electronic 100 according to an embodiment of the present invention. In FIG. 1, the electronic device 100 includes a phase locked loop (PLL) 110, a sampling and detecting circuit 120, a processing circuit 130, a timing control circuit 140, a driving circuit 150, a receiving circuit 160 and a transmission interface N1. The electronic device 100 is connected to another electronic device 102 via the transmission interface N1 and a connecting cable 104. In this embodiment, both of the electronic devices 100 and 102 are compliant to a Mobile High-Definition Link (MHL) standard, and the connecting cable 104 is an MHL transmission line. The transmission interface N1 is an "eCBUS" transmission interface compliant to the MHL 3.0 standard. Further, the electronic device 102 may serves as an audiovisual data source that transmits the audiovisual data to the electronic device 100 for playback via the connecting cable 104.

Figure 2:
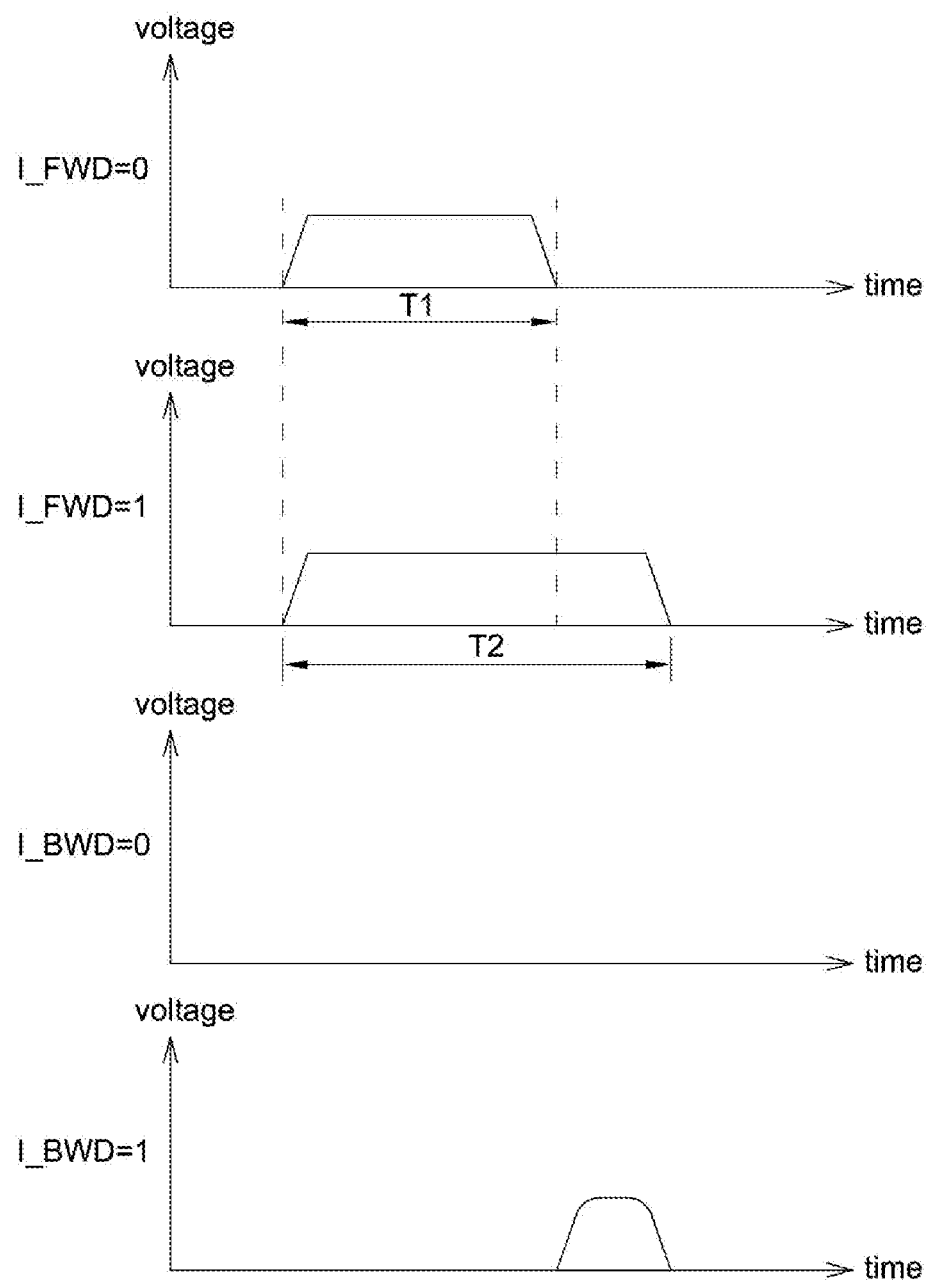
FIG. 2 is a schematic diagram of a forward signal and a backward signal corresponding to different logic values.

It should be noted that, one transmission interface N1 is depicted as the contents of the present invention involve the transmission interface N1 (i.e., the "eCBUS" node in the MHL 3.0 standard). However, one person skilled in the art can understand that, the electronic device 100 further includes other transmission interfaces/pins to connect to the connecting cable 104. In the MHL 3.0 standard, the electronic devices 100 and 102 perform bidirectional data and clock transmission using one single channel in the connecting cable 104. More specifically, the electronic device 102 transmits a forward signal I_FWD to the electronic device 100 via the channel and the transmission interface N1, and the electronic device 100 transmits a backward signal I_BWD to the electronic device 102 via the transmission interface N1 and the channel. The front edge of the forward signal I_FWD may be used as a reference clock signal for synchronizing the electronic devices 100 and 102. FIG. 2 shows a schematic diagram of the forward signal I_FWD and the backward signal I_BWD corresponding to different logic values. As shown in FIG. 2, the forward signal I_FWD has a shorter width T1 when the logic value represented by the forward signal I_FWD is "0", and has a longer width T2 when the logic value represented by the forward signal I_FWD is "1". Further, no waveform is formed when the logic value represented by the backward signal I_BWD is "0", and the backward signal I_BWD has a shorter width when the logic value represented by the backward signal I_BWD is "1".

Figure 3:
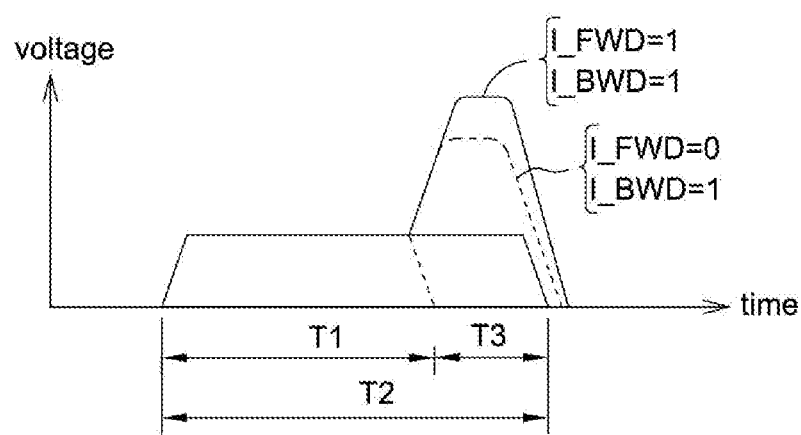
FIG. 3 is a schematic diagram of a voltage value observed on a channel or a transmission interface when the logic value represented by the backward signal is "1"
Figure 4:
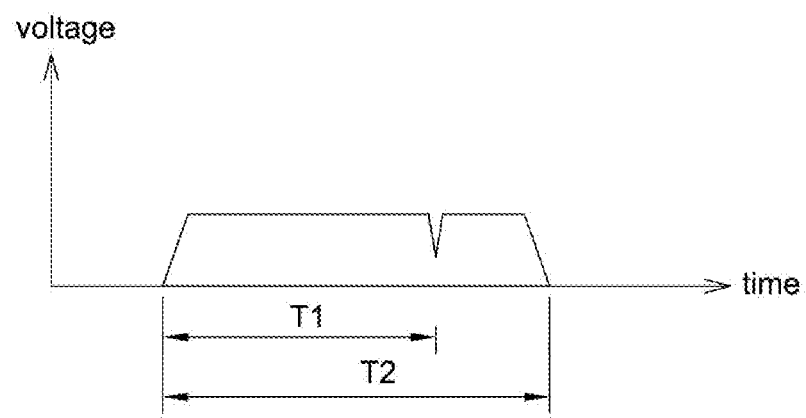
FIG. 4 is a schematic diagram of a waveform of a data signal that possibly causes an error in data determination.

FIG. 3 shows a schematic diagram of a voltage value observed on the channel or the transmission interface N1 when the logic value represented by the backward signal I_BWD is "1". Ideally, the width of the backward signal I_BWD needs to completely cover an interval between the back edge of the shorter width T1 and the back edge of the longer width T2 in the forward signal I_FWD; i.e., the width of the backward signal I_BWD ideally needs to cover a time interval T3 to prevent errors from occurring in a subsequent data process. However, the time point at which the electronic device 100 outputs the backward signal I_BWD may not be the optimum time point, in a way that the front edge or back edge of the backward signal I_BWD falls in the time interval T3, therefore an error is caused in a subsequent data process. For example, referring to FIG. 4, because the processing circuit 130 requires the width of the forward signal I_FWD in a normal operation to determine the logic value of the forward signal I_FWD, the receiving circuit 160 subtracts the received signal (i.e., I_FWD+I_BWD) received from the transmission interface N1 and a duplicated backward signal I_BWD' from each other to obtain a data signal VData. Ideally, the data signal VData is equal to the forward signal I_FWD. However, due to mismatch in the signals in the circuit, misjudgment may be later caused. For example, a notch may possibly occur in the data signal VData shown in FIG. 4 when in fact I_FWD=1. If the sample point exactly falls in the notch, the logic value of the data signal VData may be misjudged as "0". Therefore, this embodiment provides a signal processing method, in which an optimum time point for outputting the backward signal I_BWD is first identified through an auto-training mechanism, and an optimum sample point is then decided to determine the logic value of the forward signal I_FWD. Associated details are given below.

Again referring to FIG. 1, in the electronic device 100, the driving circuit 150 transmits the backward signal I_BWD to the electronic device 102 via the transmission interface N1 and the connecting cable 104; the receiving circuit 160 receives the received signal from the transmission interface N1, receives the backward signal I_BWD' from the driving circuit 150, and subtracts the received signal and the backward signal I_BWD' from each other to obtain the data signal VData. The received signal includes the forward signal I_FWD and the backward signal I_BWD. The PLL 110 generates a clock signal CK1 according to the data signal VData. In this embodiment, the data signal VData may have a frequency of 75 MHz, and the clock signal CK1 may have a frequency of 1.8 GHz. The sampling and detecting circuit 120 uses the clock signal CK1 to sample the data signal VData to generate a plurality of sample results, and detects the sample results to generate a plurality of detection results. The processing circuit 130 controls the timing control circuit 140 according to the detection results to adjust the time point at which the driving circuit 150 outputs the backward signal I_BWD.

When the electronic device 102 and the electronic device 100 are initially connected, the electronic device 100 operates in a training mode. At this point, the electronic device 102 first continuously transmits the forward signal I_FWD serving as a clock signal to the electronic device 100 for the PLL 110 in the electronic device 100 to lock the phase, and the electronic device 100 returns the backward signal I_BWD serving as a clock signal for the electronic 102 for confirmation purposes. In this embodiment, an optimum time point for outputting the backward signal I_BWD is determined in the training mode phase. In the training mode, the electronic device 100 first disables a part of the functions in the driving circuit 150, such that the driving circuit 150 generates only the backward signal I_BWD to the transmission interface N1 but not the backward signal I_BWD' (i.e., the duplicated backward signal I_BWD) to the receiving circuit 160. At this point, the data signal VData outputted by the receiving circuit 160 is the received signal including the forward signal I_FWD and the backward signal I_BWD; that is, the waveform of the data signal VData is a superimposed result of the forward signal I_FWD and the backward signal I_BWD shown in FIG. 3. In this embodiment, the frequencies of the forward signal I_FWD and the data signal VData are 75 MHz, and so the sampling and detecting circuit 120 samples the data signal VData according to the clock signal CK1 having a 1.8 GHz frequency to obtain a sample result, and then transmits the sample result to the processing circuit 130.

Figure 5:
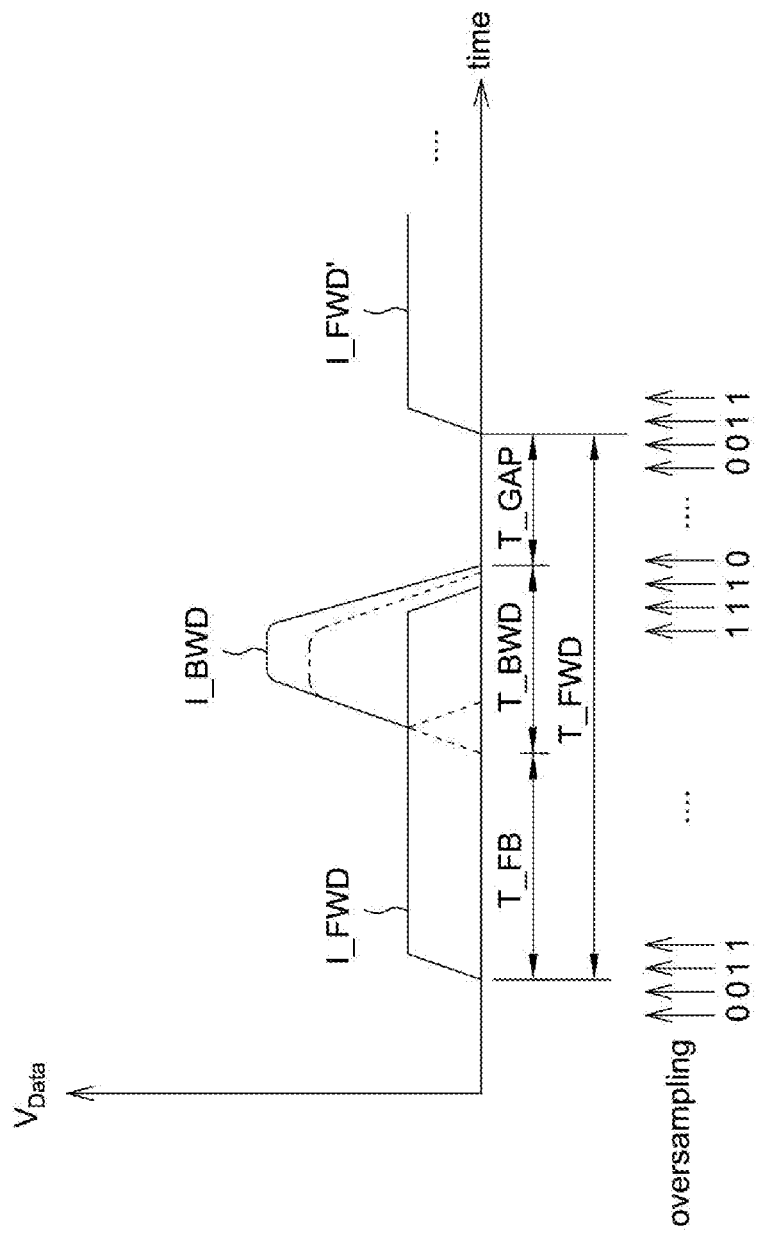
FIG. 5 is a schematic diagram of sample results obtained when a demultiplexing and timing control circuit samples negative and positive edges of a data signal according to a clock signal having a 1.8 GHz frequency.

FIG. 5 shows a schematic diagram of the sampling and detecting circuit 120 sampling the data signal VData according to the 1.8 GHz clock signal to obtain the sample result. As shown in FIG. 5, from the sample result, a time difference T_GAP between a back edge of the backward signal and the front edge of a next forward signal I_FWD' is known, and a cycle T_FWD of the forward signal I_FWD and a width W_BWD of the backward signal I_BWD are known. Thus, a time difference T_FB between the forward signal I_FWD and the backward signal I_BWD may be accurately calculated; that is, T_FB may be calculated according to an equation: T_FB=T_FWD−W_BWD−T_GAP.

After the time difference T_FB between the forward signal I_FWD and the backward signal I_BWD is calculated, the processing circuit 130 may determine whether the time difference T_FB is within a tolerable/suitable range by comparing the time difference T_FB with a predetermined value, such that the backward signal I_BWD may completely cover the interval between the back edge of the shorter width T1 and the back edge of the longer width T2 in the forward signal I_FWD (i.e., covering the time interval T3 in FIG. 3). When it is determined that the value of the time difference T_FB is unsatisfactory, i.e., the time point at which the backward signal I_BWD is outputted fails to have the backward signal I_BWD completely cover the interval between the back edge of the shorter width T1 and the back edge of the longer width T2 in the forward signal I_FWD, the processing circuit 130 outputs a control signal to control the timing control circuit 140 according to the time difference T_FB, so as to adjust the time point at which the driving circuit 150 subsequently outputs the backward signal I_BWD to further have the time difference T_FB fall in the foregoing tolerable/suitable range. Further, in one embodiment, the processing circuit 130 controls the timing control circuit 140 to adjust the time point at which the driving circuit 150 subsequently outputs the backward signal I_BWD, such that a center of the backward signal I_BWD may align with the center of the time interval T3 in FIG. 3 as much as possible; i.e., aligning with the center of the interval between the back edge of the shorter width T1 and the back edge of the longer width T2 in the forward signal I_FWD as much as possible.

Take an example for illustrations. Assuming that the width B_BWD of the backward signal I_BWD is 5 nanoseconds (ns), the shorter width T1 in the forward signal I_FWD is 5.55 ns, and the longer width T2 in the forward signal I_FWD is 8.33 ns, the ideal time difference T_FB is then 4.44 ns. That is, 4.44 ns is set as the predetermined value. If the cycle T_FB of the forward signal I_FWD is 13.33 ns, and the time difference T_GAP between the back edge of the current backward signal and the front edge of the next forward signal I_FWD' is 4.00 ns, it can be calculated that the current time difference T_FB is 4.33 ns. Thus, the processing circuit 130 may calculate that the current time difference T_FB differs from the predetermined value by 0.11 ns, and may adjust the time point at which the driving circuit 150 subsequently outputs the backward signal I_BWD through the timing control circuit 140 to further have the time difference T_FB be adjusted to 4.44 ns.

Figure 6:
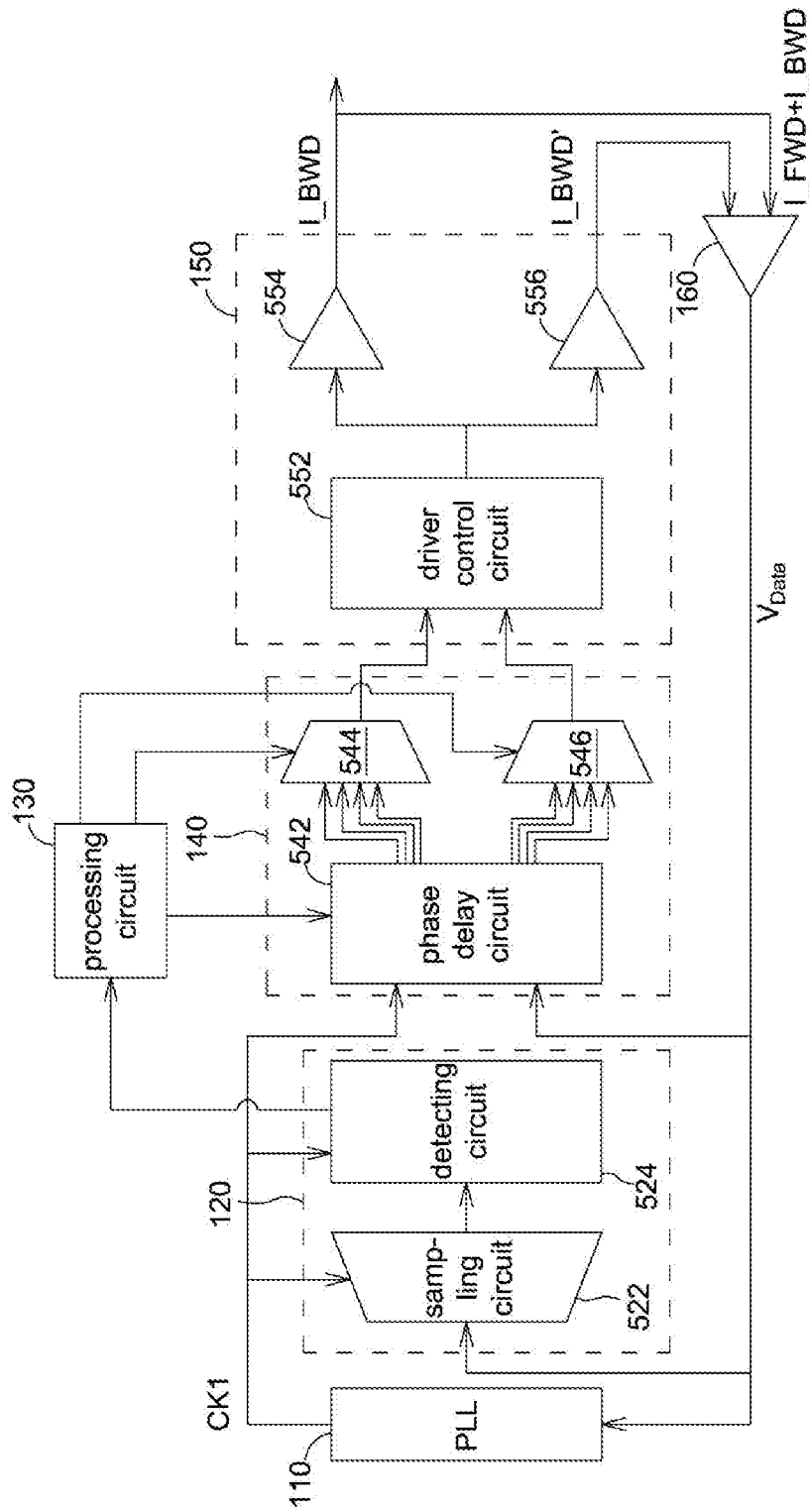
FIG. 6 is a detailed block diagram of the electronic device in FIG. 1.

FIG. 6 shows a detailed block diagram of the electronic device 100 in FIG. 1. As shown in FIG. 6, the sampling and detecting circuit 120 includes a sampling circuit 522 and a detecting circuit 524. The sampling circuit 522 samples the data signal VData according to the clock signal CK1 to generate a plurality of sample results (i.e., the sample results 0011 ... 1110 ... 0011 in FIG. 5). The detecting circuit 524 detects the transitions of the sample results (e.g., a time point at which a bit changes from 1 to 0 or from 0 to 1) to generate a plurality of detection results. The processing circuit 130 further generates a control signal to the timing control circuit 140 according to the detection results (the transition results) and certain known data. The timing control circuit 140 includes a phase delay circuit 542 and two multiplexers 544 and 546. The phase delay circuit 542 generates a plurality of signals with different time points to the multiplexers 544 and 546 according to the data signal VData and the clock signal CK1. The multiplexers 544 and 546 then generate two outputs signals that define the front and back edges of the backward signal I_BWD according to the control signal that the processing circuit 130 generates. The driving circuit 150 includes a driver control circuit 552 and two drivers 554 and 556. The driver control circuit 552 controls the drivers 554 and 556 according to the output signals of the multiplexers 544 and 546 to generate the backward signal I_BWD.

Figure 7:
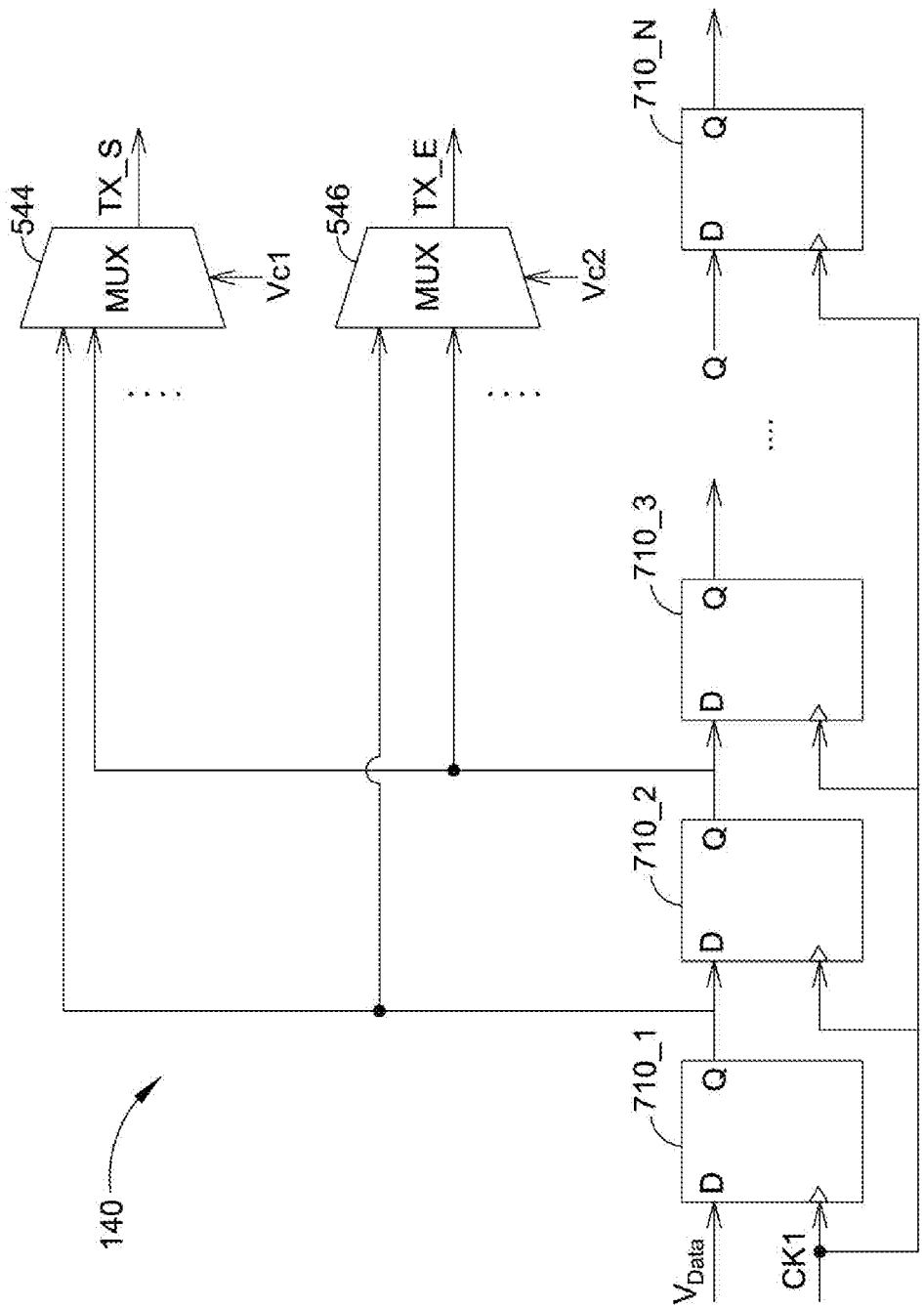
FIG. 7 is a block diagram of a phase delay circuit and two multiplexers in FIG. 6 according to an embodiment of the present invention.

FIG. 7 shows a block diagram of the phase delay circuit 542 and the two multiplexers 544 and 546 in FIG. 6. As shown in FIG. 7, the phase delay circuit 542 includes a plurality of D-flip-flops 710_1 to 710_N. As shown in FIG. 7, the D-flip-flops 710_1 to 710_N, connected in series, receive the data signal VData and are triggered by the clock signal CK1 such that the D-flip-flops 710_1 to 710_N output the data signal VData having a plurality of different phases. The multiplexer 544, connected to the outputs of a part of the D-flip-flops 710_1 to 710_N, determine the output of which D-flip-flop is to be used as an output signal TX_S of the multiplexer 544, wherein TX_S is used to determine the front edge (a starting time point) of the backward signal I_BWD. The multiplexer 546, connected to the outputs of a part of the D-flip-flops 710_1 to 710_N, determine the output of which D-flip-flop is to be used as an output signal TX_E of the multiplexer 546, wherein TX_E is used to determine the back edge (an ending time point) of the backward signal I_BWD. For example, assume that a control signal VC1 controls the multiplexer 544 to output the output of the $8^{th}$ D-flip-flip as the output signal TX_S, and a control signal VC2 controls the multiplexer 546 to output the output of the $18^{th}$ D-flip-flop as the output signal TX_E. Thus, when the level of the output of the $8^{th}$ D-flip-flop changes from "0" to "1", the driving circuit 150 controls the level of the backward signal I_BWD to change from "0" to "1", when the level of the output of the $18^{th}$ D-flip-flop changes from "1" to "0", the driving circuit 150 controls the level of the backward signal I_BWD to change from "1" to "0". As described, the processing circuit 130 may again determine the time point for outputting the backward signal I_BWD through determining the control signals VC1 and VC2, and may further adjust the width of the backward signal I_BWD.

After the optimum time point for outputting the backward signal I_BWD is determined, the normal mode phase is conducted, and the electronic device 100 operates in the normal mode to transceive data to/from the electronic device 102. In the normal mode, the part of the functions of the driving circuit 150 that are previously disabled are enabled to output the backward signal I_BWD to the receiving circuit 160. The receiving circuit 160 subtracts the received signal obtained from the transmission interface N1 and the backward signal I_BWD from each other to obtain the data signal VData, which is the forward signal I_FWD. It should be noted that, because the time point for outputting the backward signal I_BWD has been adjusted, in the normal mode phase, to ensure that the backward signal I_BWD completely covers an interval between the back edge of the shorter width T1 and the back edge of the longer width T2 in the forward signal I_FWD, the sampling and detecting circuit 120 samples and detects a plurality of data signals VData outputted from the receiving circuit 160, and the processing circuit 130 calculates two different back edge positions of the forward signal I_FWD and respective back edge average positions to obtain an optimum sampling position, which may be directly used to determine the logic value of the forward signal I_FWD. In one embodiment of the present invention, the processing circuit 130 calculates an intermediate point of two different average back edge positions as the optimum sampling position. For example, assuming that the average back edge position of the shorter width T1 in the forward signal I_FWD is located at the $19.2^{nd}$ sample point and the average back edge position of the longer width T2 in the forward signal I_FWD is located at the $28.8^{th}$ sample point, the processing circuit 130 may then directly adopt the value of the $24^{th}$ sample point as the logic value of the forward signal I_FWD without needing to consider values of other sample points.

Figure 8:
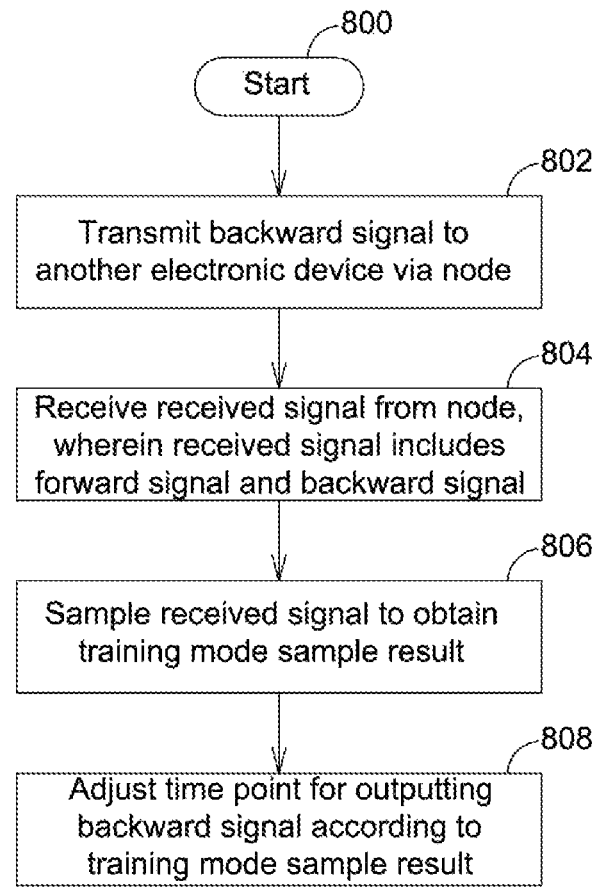
FIG. 8 is a flowchart of a signal processing method in a training mode phase according to an embodiment of the present invention.

FIG. 8 shows a flowchart of a process of a signal processing method in a training mode phase according to an embodiment of the present invention. Referring to the above disclosure, the process includes following steps.

In step 800, the process begins.

In step 802, a backward signal is transmitted to another electronic device via a node.

In step 804, a received signal, which includes a forward signal and the backward signal, is received from the node.

In step 806, the received signal is sampled to obtain a training mode sample result.

In step 808, a time point for outputting the backward signal is adjusted according to the training mode sample result.

Figure 9:
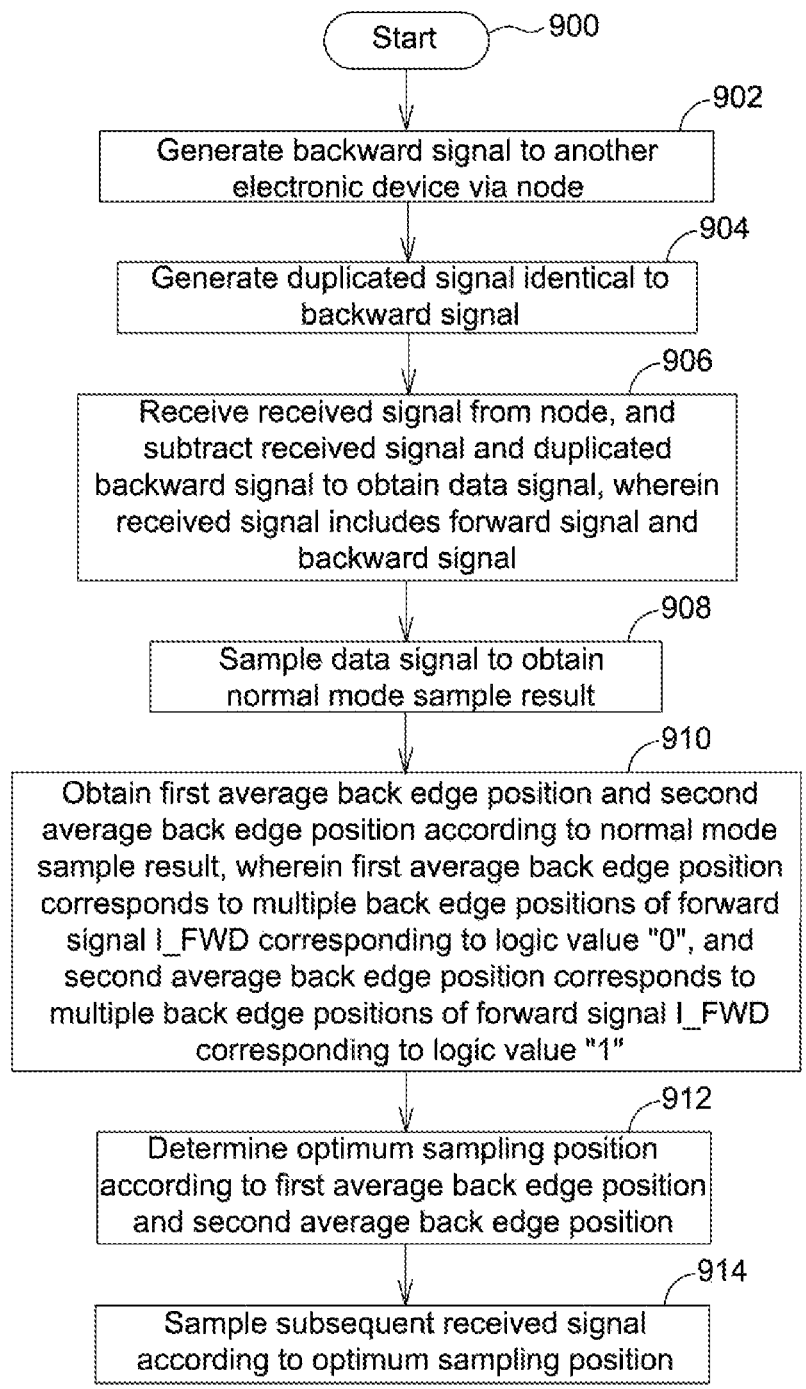
FIG. 9 is a flowchart of a signal processing method in a normal mode phase according to an embodiment of the present invention.

FIG. 9 shows a flowchart of a process of a signal processing method in a normal mode phase according to an embodiment of the present invention. Referring to the above disclosure, the process includes following steps.

In step 900, the process begins.

In step 902, a backward signal is transmitted to another electronic device via a node.

In step 904, a duplicated backward signal identical to the backward signal is generated.

In step 906, a received signal is received from the node, and the received signal and the duplicated backward signal are subtracted from each other to obtain a data signal, wherein the received signal includes a forward signal and the backward signal.

In step 908, the data signal is sampled to obtain a normal mode sample result.

In step 910, a first average back edge position and a second average back position are calculated according to the normal mode sample result. The first average back edge position corresponds an average of a plurality of back edge positions of the forward signal I_FWD that are in a logic value "0". The second average back edge position corresponds to an average of a plurality of back edge positions of the forward signal I_FWD that are in a logic value "1".

In step 912, an optimum sampling position is determined according to the first average back edge position and the second average back edge position.

In step 914, the subsequent received signal is sampled according to the optimum sampling position.

In conclusion, in the electronic device and the associated signal processing method of the present invention, the time point at which the backward signal is transmitted to another electronic device may be accurately determined in the training mode, and the forward signal from the another electronic device may be accurately read in a normal mode phase, thereby solving issues of the prior art.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a transmission interface, for connecting to another electronic device via a connecting cable;
   a driving circuit, outputting a backward signal to the another electronic device via the transmission interface;
   a receiving circuit, receiving a received signal from the transmission interface, the received signal comprising a forward signal and the backward signal, the forward signal outputted from the another electronic device;
   a sampling circuit, sampling the received signal to obtain a plurality of sample results;
   a detecting circuit, detecting transitions of the sample results to obtain a plurality of detection results;
   a timing control circuit, controlling a time point at which the driving circuit outputs the backward signal and a width of the backward signal; and
   a processing circuit, generating a control signal according to the detection results to adjust the time point at which the driving circuit outputs the backward signal.

2. The electronic device according to claim 1, wherein the processing circuit generates the control signal according to a cycle of the forward signal, a width of the backward signal, a predetermined value and the detection results.

3. The electronic device according to claim 1, wherein the detection results comprise a back edge of the backward signal and a front edge of a next forward signal.

4. The electronic device according to claim 1, wherein the forward signal comprises a front edge and a first back edge when corresponding to a first logic value, and comprises the front edge and a second back edge when corresponding to a second logic value, and the backward signal with an adjusted output time point completely covers an interval between the first back edge and the second back edge.

5. The electronic device according to claim 1, wherein in a training mode, the sampling circuit samples the received signal to obtain a plurality of training mode sample results, and the detecting circuit detects the training mode sample results to obtain a plurality of training mode detection results; in a normal mode, the receiving circuit further receives a duplicated backward signal from the driving circuit, and subtracts the received signal and the duplicated backward signal from each other to obtain a data signal, the sampling circuit samples the data signal to obtain a plurality of normal mode sample results, the detecting circuit detects the normal mode sample results to obtain a plurality of normal mode detection results, and the processing circuit determines a sampling position according to the normal mode detection results.

6. The electronic device according to claim 5, operating in the training mode when initially connected to the another electronic device.

7. The electronic device according to claim 5, wherein the forward signal comprising a front edge and a first back edge when corresponding to a first logic value, and comprising the front edge and a second back edge when corresponding to a second logic value, and the processing circuit calculates an average first back edge position and an average second back edge position of the forward signal according to the normal mode detection results in the normal mode and accordingly obtains the sampling position.

8. The electronic device according to claim 7, wherein the processing circuit calculates an intermediate point of the average first back edge position and the average second back edge position as the sampling position.

9. The electronic device according to claim 1, wherein the timing control circuit comprises:
   a phase delay circuit, generating a plurality of data signals having different phases;
   a first multiplexer, outputting a first output signal according to one of the data signals; and
   a second multiplexer, outputting a second output signal according to another of the data signals; and
   the driving circuit comprises:
   a driver control circuit, generating a driver control signal according to the first output signal and the second output signal; and
   a driver, outputting the backward signal according to the driver control signal.

10. The electronic device according to claim 9, wherein the first multiplexer is controlled by the processing circuit to output the first output signal.

11. A signal processing method, applied to an electronic device that is connected to another electronic device via a transmission interface, the signal processing method comprising:
- transmitting a backward signal to the another electronic device via the transmission interface;
- receiving a received signal from the transmission interface, the received signal comprising a forward signal and the backward signal, the forward signal outputted from the another electronic device;
- sampling the received signal to obtain a plurality of sample results;
- detecting transitions of the sample results to obtain a plurality of detection results; and
- generating a control signal according to the detection results, and accordingly adjusting a time point for outputting the backward signal,
- wherein the step of generating the control signal according to the detection results and accordingly generating the time point for outputting the backward signal comprises:
- generating the control signal according to a cycle of the forward signal, a width of the backward signal, a predetermined value and the detection results.

12. The signal processing method according to claim 11, wherein the detection results comprise a back edge of the backward signal and a front edge of a next forward signal.

13. The signal processing method according to claim 11, wherein the forward signal comprises a front edge and a first back edge when corresponding to a first logic value, and comprises the front edge and a second back edge when corresponding to a second logic value, and the backward signal with an adjusted output time point completely covers an interval between the first back edge and the second back edge.

14. The signal processing method according to claim 11, wherein the steps of sampling the received signal to obtain the plurality of sample results, and detecting the sample results to obtain the plurality of detection results are performed in a training mode; the signal processing method further comprising:
- in a normal mode:
  - receiving a duplicated backward signal subtracting the received signal and the duplicated signal from each other to obtain a data signal;
  - sampling the data signal to obtain a plurality of normal mode sample results;
  - detecting the normal mode sample results to obtain a plurality of normal mode detection results; and
  - determining a sampling position according to the normal mode detection results.

15. The signal processing method according to claim 14, wherein the electronic device operates in the training mode when initially connected to the another electronic device.

16. The signal processing method according to claim 14, wherein the forward signal comprises a front edge and a first back edge when corresponding to a first logic value, and comprises the front edge and a second back edge when corresponding to a second logic value; the step of determining the sampling position according to the normal mode detection results comprises:
- in the normal mode, calculating an average first back edge position and an average second back edge position of the forward signal according to the normal mode detection results and accordingly obtaining the sampling position.

17. The signal processing method according to claim 16, wherein the step of obtaining the sampling position comprises:
- calculating an intermediate point of the average first back edge position and the average second back edge position as the sampling position.

18. The signal processing method according to claim 11, wherein the step of controlling the time point for outputting the backward signal comprises:
- generating a plurality of data signals having different phases;
- outputting a first output signal according to one of the data signals;
- outputting a second output signal according to another of the data signals;
- generating a driver control signal according to the first output signal and the second output signal; and
- outputting the backward signal according to the driver control signal.

* * * * *